US006409896B2

(12) United States Patent
Crocker

(10) Patent No.: US 6,409,896 B2
(45) Date of Patent: *Jun. 25, 2002

(54) METHOD AND APPARATUS FOR SEMICONDUCTOR WAFER PROCESS MONITORING

(75) Inventor: Steve Crocker, Sunnyvale, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/452,750

(22) Filed: Dec. 1, 1999

(51) Int. Cl.⁷ .......................... C23C 14/00; C23C 16/00
(52) U.S. Cl. ........................... 204/298.03; 204/298.32; 204/298.01; 204/298.31; 204/192.1; 204/192.32; 118/723 E; 118/723 VE
(58) Field of Search .................. 204/298, 298.03, 204/298.08, 298.12, 192.32, 192.1, 192.33, 298.01, 298.02; 118/723 VE, 723 E

(56) References Cited

U.S. PATENT DOCUMENTS

| 4,021,277 | A | * | 5/1977 | Shirn et al. ................ 216/51 |
| 4,358,686 | A | | 11/1982 | Kinoshita ................ 250/492.2 |
| 4,362,611 | A | * | 12/1982 | Logan et al. ................ 204/298 |
| 4,608,493 | A | | 8/1986 | Hayafuji ................ 250/397 |
| 4,859,908 | A | | 8/1989 | Yoshida et al. ......... 315/111.81 |
| 5,068,539 | A | | 11/1991 | Nogami et al. .......... 250/492.2 |
| 5,294,320 | A | * | 3/1994 | Somekh et al. ........ 204/298.11 |
| 5,451,784 | A | | 9/1995 | Loewenhardt et al. ...... 240/305 |
| 5,451,884 | A | | 9/1995 | Sauerland ................ 324/760 |
| 5,557,215 | A | | 9/1996 | Saeki et al. ................ 324/765 |
| 5,667,701 | A | | 9/1997 | Sato et al. ................ 216/61 |
| 5,772,858 | A | * | 6/1998 | Tepman ................ 204/192.12 |
| 5,801,386 | A | | 9/1998 | Todorov et al. ............ 250/397 |
| 5,810,963 | A | | 9/1998 | Tomioka ................ 156/345 |

FOREIGN PATENT DOCUMENTS

EP 0 865 070 A1 9/1998 ............ H01J/37/34

OTHER PUBLICATIONS

Lindley, R.A. et al. "Magnetic Field Optimization in a Dielectric Magnetically Enhanced Reactive Ion Etch Reactor to Produce an Instantaneously Uniform Plasma", pp. 1600–1603, May/Jun. 1998.

* cited by examiner

Primary Examiner—Gregory Mills
Assistant Examiner—P. Hassanzadeh
(74) Attorney, Agent, or Firm—Thomason, Moser & Patterson, LLP

(57) ABSTRACT

A method and apparatus for detecting the presence of a plasma. The apparatus comprises an electrically floating contact member that is exposed to a plasma forming region, for example, a semiconductor wafer processing chamber. The floating contact is coupled to a measuring device. When a plasma is present in the plasma forming region, the plasma induces a voltage upon the floating contact which is detected by the measuring device.

21 Claims, 2 Drawing Sheets

METHOD AND APPARATUS FOR SEMICONDUCTOR WAFER PROCESS MONITORING

BACKGROUND OF THE DISCLOSURE

1. Field of Invention

The present invention relates generally to an apparatus and concomitant method for monitoring processes in a semiconductor process chamber. More specifically, the invention relates to an apparatus that detects a plasma in the process chamber.

2. Background of Invention

During many semiconductor processing operations, it is critical to maintain a substrate stationary during processing. To achieve these ends, substrate support pedestals often are equipped with substrate retaining devices such as electrostatic, mechanical, and/or vacuum chucks in order to hold the substrate to a support surface of the pedestal. Pedestals equipped with electrostatic chucks are commonly chosen as retaining devices because of their rapid activation and deactivation times, low likelihood of substrate damage and exposure of the entire wafer face during processing.

Electrostatic chucks operate by supplying DC voltage to an embedded electrode within a dielectric material. The applied voltage produces a charge on the support surface of the electrostatic chuck, which in turn induces an electrostatic potential of opposite polarity on a backside of the substrate adjacent the support surface. This electrostatic potential affixes a substrate to the pedestal during processing.

The resistivity of the support surface is an important parameter for chucking and de-chucking performance (i.e., the repeated clamping and releasing of the substrate from the support surface). Maintaining an intended characteristic resistivity at the support surface prevents charge migration and current flow that degrades the chucking force. Contaminants upon the chuck surface often increase the resistively of the chuck thereby parasitically altering the chucking performance. As such, the support surface of the electrostatic chuck must be free of contaminants in order to function reliably. Once substantial current leakage occurs or a residual charge is established within the electrostatic chuck, the result is a reduced or total loss of chucking force.

A common form of electrostatic chuck surface contamination is the absorption of gases, or their reaction with the support surface of the electrostatic chuck (typically a ceramic material), when the process chamber is vented to atmosphere. The exposure of the support surface containing residual atmospheric gases to high temperatures during wafer processing creates a low resistance contamination film across the support surface. Over time, the repeated venting of the chamber and exposure to elevated temperatures during processing multiple wafers cases, the contamination film increase in thickness and decreases in resistance. When the resistivity of the contamination film is lower than that of the ceramic, the electrostatic chuck begins to set up the opposite polarity charge in the contamination film itself, and not the substrate on top of the contamination film. Thus, chucking force between the substrate and the pedestal is lost.

The impact of the contamination film on chucking performance depends on the thickness and resistivity of the contamination film as well as the operating temperature of the electrostatic chuck. Because the bulk resistivity of the electrostatic chuck material is inversely proportional to its temperature, the impact of the conductive contamination film is more severe at lower temperatures where the bulk resistivity is higher. Hence, if weak chucking force is observed at higher temperatures, the electrostatic chuck will exhibit almost no chucking force at lower temperatures. The primary variables which govern the formation of a contamination film on the chuck are operating temperature, time at temperature, and time of exposure to atmosphere.

The contamination film will continue to grow on the surface of the electrostatic chuck until the formed contamination film is removed by a maintenance procedure. Maintenance is performed periodically to remove contaminant films from the electrostatic chuck support surface.

One maintenance procedure consists of a low power in-situ plasma etch which sputters contaminants off the support surface of the electrostatic chuck. To perform this maintenance procedure, an RF generator, an auto-tuning RF match, and a service controller are installed on the applicable chamber. A plasma is generated within process chamber by applying RF power to the electrodes within the electrostatic chuck, while flowing argon gas into the chamber. Negative bias on the chuck, with respect to the plasma, causes argon ion bombardment of the chuck surface, wherein the ions "sputter" off the contaminant layer. After the plasma etch has been performed and all contaminants have been removed, the electrostatic chuck has been restored to a condition to run substrates until the next maintenance service interval.

One problem associated with using low power plasma etching is the difficulty in confirming that the plasma has been struck, initiating the cleaning, or etch cycle. Some process chambers are equipped with windows that allow viewing of the interior of the chamber. Thus, a user may be able to visually identify the presence of the plasma by viewing the plasma "glow". However, not all chambers have the window positioned to allow for easy viewing of the plasma, while other chambers are fitted with process kits that frequently obstruct the line of sight between the window and the portion of the chamber containing the plasma. As such, verification of the presence of the plasma is often very difficult.

If the removal of the contaminants from the electrostatic chuck is not successful, the cleaning process must be repeated. This repetition of the maintenance procedure leads to increased process chamber downtime, and correspondingly, reduced product throughput. Therefore, there is a need in the art for an apparatus that facilitates the detection of plasma in a semiconductor process chamber.

SUMMARY OF INVENTION

The disadvantages associated with the prior art are overcome by a plasma detection system that facilitates determining a presence of a plasma within a semiconductor process chamber. A plasma detection system comprises a floating contact, i.e., electrically "floating" from ground, exposed to a plasma forming region of a process chamber and coupled to a measuring device. The measuring device detects an increase in voltage on the floating contact when the plasma is struck in the plasma forming region, thus indicating the presence of the plasma in the process chamber.

A method for detecting presence of a plasma in a processing chamber is also disclosed. The method comprises the steps of electrically floating a contact exposed to a plasma forming region of the processing chamber, striking a plasma in the plasma forming region and measuring a voltage level of the contact.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAIL DESCRIPTION OF INVENTION

Figure 1:
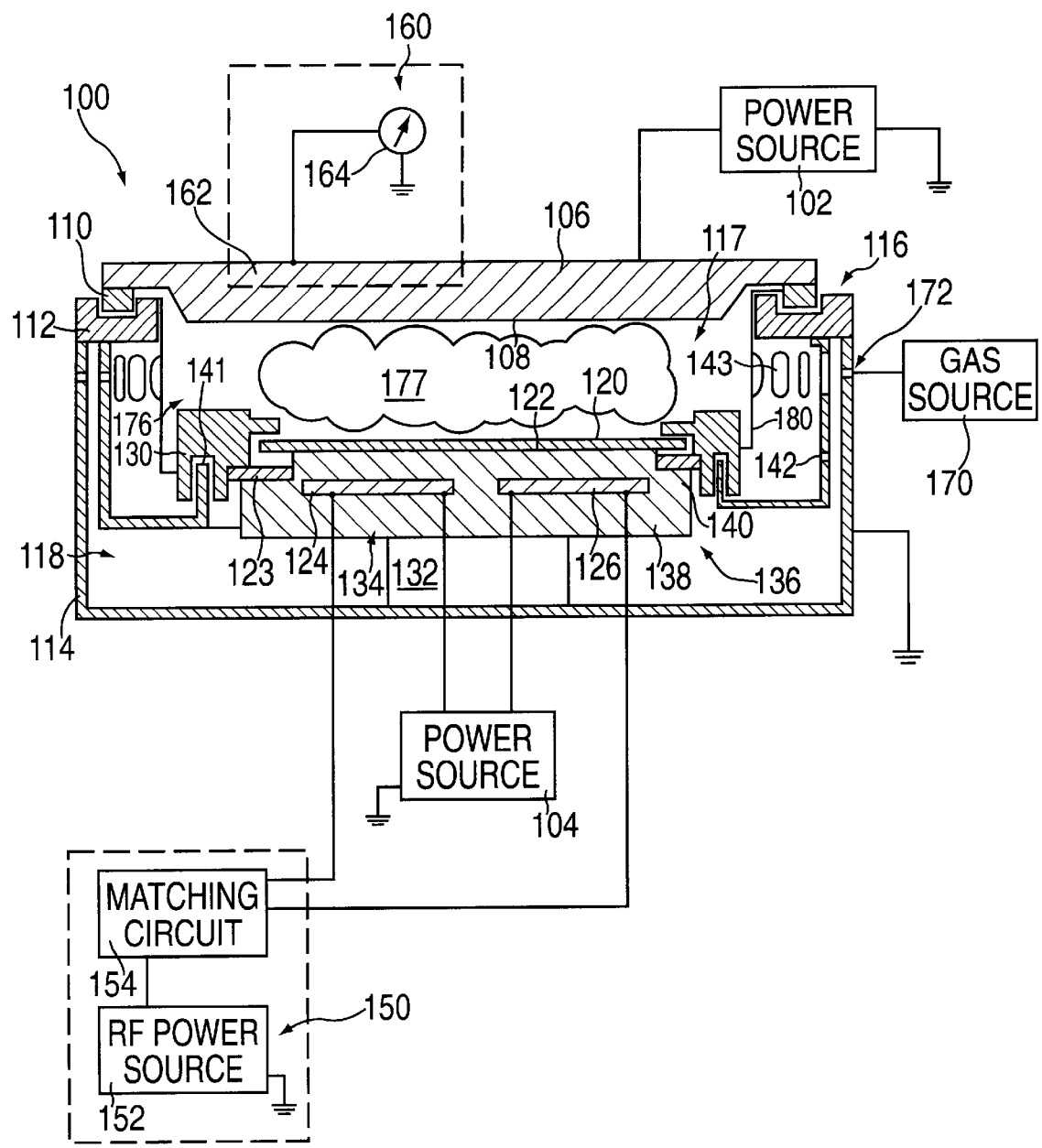
FIG. 1 is a simplified schematic of a semiconductor process chamber comprising a plasma detection system; and, FIG. 2 is a partial cross sectional view of an alternate embodiment of a plasma detection system.

FIG. 1 is a simplified schematic drawing illustrating a plasma detection system 160 of the present invention incorporated in a semiconductor wafer processing system 100. The invention effectively indicates when a plasma is present in the semiconductor processing system 100. The invention is generally applicable to deposition chambers of semiconductor wafer processing systems, including, for example, physical vapor deposition (PVD) or sputtering chambers, chemical vapor deposition (CVD) chambers, and ion implant chambers. The invention is also applicable wherever an electrostatic chuck is used to retain a substrate within the chamber having plasma processing or cleaning cycles.

By way of example, FIG. 1 schematically illustrates a PVD or sputtering system 100. The system 100 contains a process chamber 116, a gas panel 170, a cleaning system 150 and a plasma detection system 160. The substrate 120 (e.g., a semiconductor wafer) is positioned within the process chamber 116 during processing. Please note, conventional hardware components such as vacuum pumps are omitted for clarity.

The exemplary process chamber 116 includes a grounded, cylindrical chamber wall 114 and a support ring 112 that is mounted to the top of the chamber wall 114. A target plate 106 is disposed upon the chamber wall 114 and closes the process chamber 116, defining an interior volume 117. The target plate 106 is electrically insulated from the chamber walls 114 by an annular insulator 110 that separates the target plate 106 and the support ring 112. Generally, to ensure the integrity of the vacuum in the process chamber 116, O-rings (not shown) are used above and below the insulator 110 to provide a vacuum seal.

The target plate 106 may be fabricated of a material that will become the deposition species or it may contain a coating 108 of the deposition species. To facilitate the sputtering process, a high voltage DC power source 102 is connected between the target 106 and the electrically grounded chamber walls 114.

An electrostatic chuck 136 retains and supports the substrate 120 within the process chamber 116. The electrostatic chuck 136 is mounted upon an elevator system 132 that provides vertical motion to the electrostatic chuck 136. A flange 140 extends from the perimeter of the electrostatic chuck 136 and supports an alignment ring 128.

In one embodiment of the invention, the electrostatic chuck 136 contains one or more electrodes 134, for example, a first electrode 124 and a second electrode 126, imbedded within a ceramic chuck body 138. In a conventional manner, the electrodes 124 and 126 are driven by voltage from an electrode power source 104 and, in response to application of the voltage, the substrate 120 is electrostatically clamped to the support surface 122 of the electrostatic chuck 136.

The ceramic chuck body 138 is, for example, fabricated of aluminum-nitride or boron-nitride. Such a relatively low resistivity material promotes the Johnsen-Rahbek effect during high temperature processing. Other relatively low resistivity ceramics also form useful high temperature chuck materials such as alumina doped with a titanium oxide or a chromium oxide. If the electrostatic chuck 138 is to be used at low temperatures only, then other ceramic and/or dielectric materials such as alumina are used to form the chuck body 138.

An illustrative ceramic electrostatic chuck is disclosed in U.S. Pat. No. 5,117,121, issued May 26, 1992, and U.S. Pat. No. 5,656,093, issued Aug. 12, 1997, both of which are herein incorporated by reference. Examples of non-ceramic electrostatic chucks are disclosed in U.S. Pat. No. 4,184,188, issued Jan. 15, 1980 and U.S. Pat. No. 4,384,918, issued May 24, 1983, both of which are incorporated herein by reference.

A shield assembly 118 is disposed within the process chamber 116. The shield assembly 118 comprises a skirt 180, a perforated cylindrical shield member 142, and a shadow ring 130. The skirt 180, shield member 142 and the shadow ring 130 are inter-leafed as to allow gas passage and while shielding chamber components from the effects of deposition. The skirt 180 is secured between the target plate 106 and the support ring 112, and extends downward into the chamber volume 117.

The shield member 142 is affixed to the support ring 112 and circumscribes the skirt 180 in a "J" profile. The shield member 142 terminates in an end 141.

The shadow ring 130 rests upon the end 141 when the elevator system 132 (and thus the electrostatic chuck 136) is in a lowered position. The shadow ring 130 alternately rests upon the alignment ring 128 when the elevator system is in an upper position. The shadow ring 130 has an inner diameter selected so that the shadow ring 130 fits peripherally over the edge of the substrate 120 without contacting the substrate 120.

The gas panel 170 is coupled to process chamber 116 and supplies argon or other suitable process gases to enter process chamber 116 through one or more gas inlets 172 disposed about the chamber walls 114. Argon, entering the interior volume 117, passes through a plurality of perforations 143 in the shield member 142, then passes between the skirt 180 and shadow ring 130, and enters a processing region 176 defined by the target plate 106, electrostatic chuck 136 and the shield assembly 118.

The cleaning system 150 comprises an RF generator 152 and a matching circuit 154. The RF generator 152 is coupled to the matching circuit 154. The matching circuit is coupled to at least one of the one or more electrodes 134 within the electrostatic chuck 136. The cleaning system 150 is typically utilized periodically to remove contaminants from the electrostatic chuck 136 as part of a maintenance program. The cleaning system 150 operates by applying RF power to the at least one of the one or more electrodes 134, striking a plasma 177 from argon supplied to the process chamber 116 from the gas panel 170. The argon is ionized in the plasma 177 and subsequently etches the support surface 122 of the electrostatic chuck 136, thus removing contaminants that may be disposed upon the support surface 122. An example of such a cleaning system is described in the commonly assigned European Patent Application No. EP0865070A1, filed Aug. 4, 1997, by Khurana et al., and is hereby incorporated by reference in its entirety.

The plasma detection system 160 comprises a floating contact 162 coupled to a measuring device 164. The floating contact 162 is electrically isolated from ground (i.e., electrically floating). The floating contact 162 additionally is exposed to the processing region 176 of the process chamber 116 in which the plasma 177 is formed. In one embodiment, the floating contact 162 is the target plate 106. Note that in order for the target plate 106 to float from ground, the power source 102 must not provide a ground path during time of plasma detection.

Figure 2:
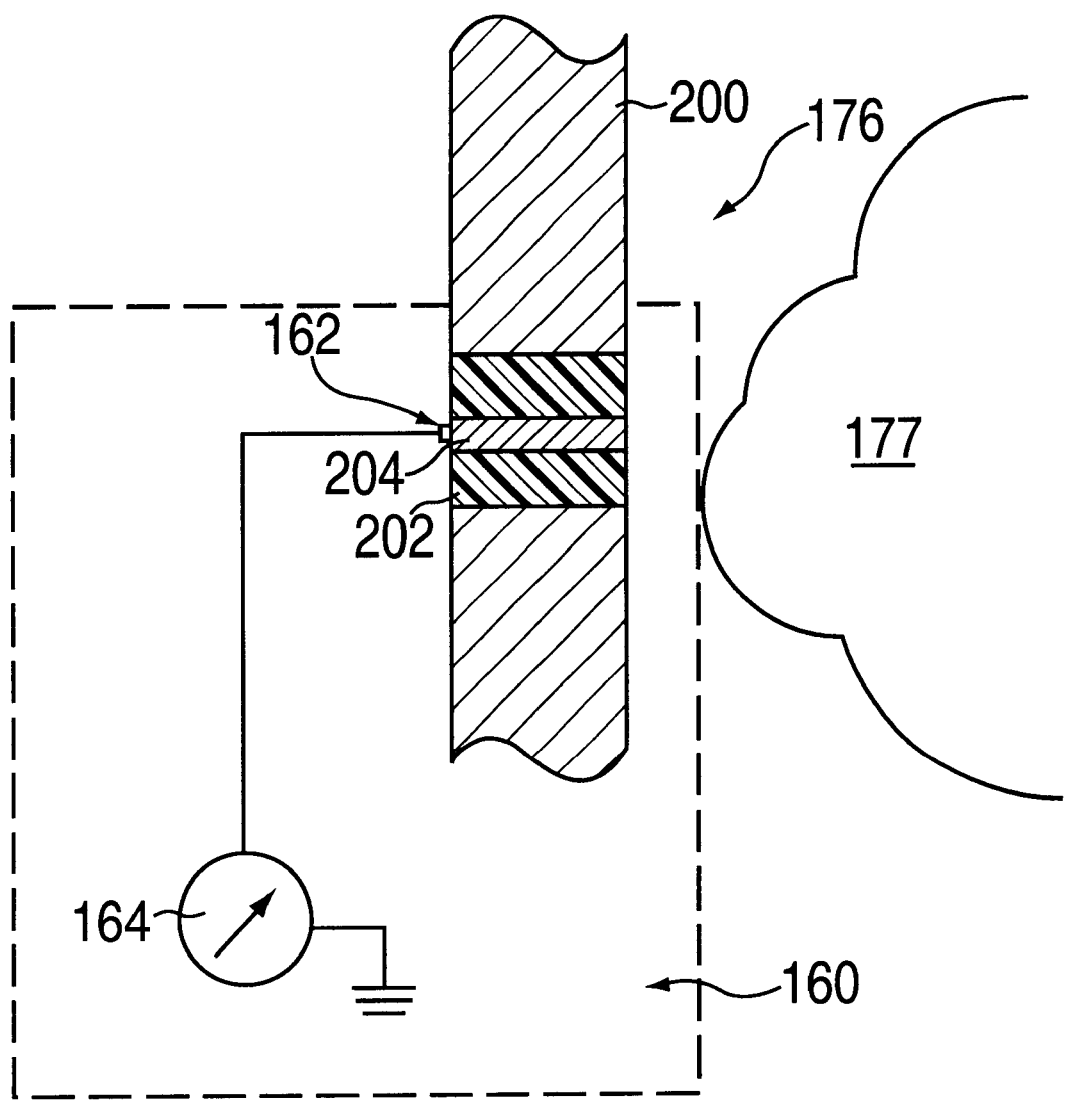

Depicted in FIG. 2 is an alternate embodiment of the floating contact 162 comprising a conductive member 204 affixed to the process chamber 116. The conductive member 204 is exposed to the processing region 176 of the process chamber 116 in which the plasma 177 is formed. The conductive member 204 is electrically isolated from other chamber defining structures 200 (lid, targets, walls, and the like which bound the processing region 176) by a dielectric insulator 202 as to allow the conductive member 204 to electrically float. The conductive member 204 is coupled to the measuring device 164. The operation of the. embodiment depicted in FIG. 2 follows as described in the discussion of the embodiment depicted in FIG. 1 below.

Returning to FIG. 1, the measuring device 164 detects a change in voltage of the floating contact 162. In one embodiment, the measuring device 164 is a voltmeter. Please note that one skilled in the art may measure a change in voltage of a body (i.e., the floating contact) through numerous well-known methods. As such, the use of alternate methods for determining voltage measurements that are well-known in the art, should be considered within the scope of the teachings described herein.

In operation, the electrostatic chuck 136 accumulates contamination on the support surface 122 during processing a plurality of substrates 120. To remove the contamination from the support surface 122, a cleaning cycle is initiated. A cleaning gas, for example argon, is supplied to the process chamber 116 from the gas panel 170. RF power from the cleaning system 150 of approximately 75 Watts is applied to the electrodes 124 and 126. Plasma 177 is struck and the contaminants are etched from the support surface 122. The plasma 177 induces a bias voltage to the floating contact 162 with respect to ground. The floating contact 162 experiences a voltage rise due to the plasma 177.

In one embodiment, the floating contact is induced with a voltage by the plasma that causes a rise in the voltage of the floating contact from zero (or trace millivolts) to a voltage in the range of about 3.6 to about 7.0 volts. The voltage will vary in other embodiments due to changes in the chamber configuration, target material and condition, RF voltage, argon flow and the like.

Although various embodiments which incorporate the teachings of the present invention have been shown and described in detail herein, those skilled in the art can readily devise many other varied embodiments that still incorporate these teachings.

What is claimed is:

1. Apparatus for detecting a plasma in a plasma processing chamber having a chamber sidewall, said apparatus comprising:

an electrically floating deposition target plate disposed above said sidewall, said electrically floating deposition target plate changing in electrical potential when exposed to said plasma; and a measuring device coupled to said electrically floating deposition target plate for detecting the change in electrical potential on the target plate indicative of a presence of a plasma formation during a cleaning cycle.

2. The apparatus of claim 1 wherein the electrically floating deposition target plate obtains a bias voltage when exposed to said plasma.

3. The apparatus of claim 1 wherein said measuring device further comprises a voltmeter.

4. The apparatus of claim 1 further comprising:

an electrostatic chuck disposed within said process chamber.

5. The apparatus of claim 1 wherein the electrically floating target plate is a lid of the plasma processing chamber.

6. The apparatus of claim 1 wherein the electrically floating target plate is a lid of the plasma processing chamber having a coating of sputtering material disposed thereupon.

7. Apparatus for detecting plasma comprising:

a process chamber having walls and a lid defining a plasma processing region;

a sputtering target disposed upon said lid, said sputtering target exposed to said plasma processing region; and a measuring device, coupled to said sputtering target and disposed external to the process chamber for detecting the change in electrical potential on the target plate indicative of a presence of a plasma formation during a cleaning cycle.

8. The apparatus of claim 7 wherein said process chamber further comprises:

an electrostatic chuck having at least one embedded electrode, said electrostatic chuck disposed within said process chamber.

9. The apparatus of claim 7 wherein said process chamber further comprises:

a cleaning system.

10. The apparatus of claim 9 further comprising:

a power source coupled to said sputtering target wherein said power source electrically floats from ground when said cleaning system is energized.

11. The apparatus of claim 7 wherein the sputtering target obtains a bias voltage when exposed to said plasma.

12. The apparatus of claim 7 wherein said measuring device further comprises a voltmeter.

13. The apparatus of claim 7 wherein said process chamber is a physical vapor deposition chamber.

14. The apparatus of claim 7 wherein the sputtering target is the lid fabricated of sputtering material.

15. The apparatus of claim 7 wherein the sputtering target is the lid further comprising a coating of sputtering material disposed thereupon.

16. Apparatus for detecting a plasma in a plasma processing chamber having a grounded chamber sidewall, said apparatus comprising:

an electrostatic chuck having at least one electrode embedded therein, said at least one electrode adapted for receiving RF power to ignite a gas within said chamber to form said plasma;

a deposition target plate disposed above said sidewall, said target plate electrically floating with respect to said grounded sidewall and changing in electrical potential when exposed to said plasma; and a measuring device coupled to said electrically floating deposition target plate for detecting the change in electrical potential on the target plate indicative of a presence of a plasma formation during a cleaning cycle.

17. The apparatus of claim 16, wherein said process chamber further comprises:

a cleaning system coupled to the electrostatic chuck.

18. The apparatus of claim 17, wherein the cleaning system comprises;

an RF generator; and a matching network.

19. The apparatus of claim 16, wherein said measuring device further comprises a voltage isolation voltmeter.

20. The apparatus of claim 16, wherein said process chamber is a physical vapor deposition chamber.

21. The apparatus of claim 16, wherein the electrically floating deposition target plate is a lid of the plasma processing chamber.

* * * * *